United States Patent
Eckert et al.

(10) Patent No.: US 7,006,843 B1
(45) Date of Patent: Feb. 28, 2006

(54) METHOD AND APPARATUS FOR REGULATING THE POWER OF A TRANSMIT AMPLIFIER

(75) Inventors: Rainer Eckert, Munich (DE); Helmut Fuenfgelder, Dietersheim (DE); Lothar Mamier, Munich (DE); Volker Wannenmacher, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/913,579

(22) PCT Filed: Feb. 1, 2000

(86) PCT No.: PCT/DE00/00275

§ 371 (c)(1), (2), (4) Date: Aug. 13, 2001

(87) PCT Pub. No.: WO00/48312

PCT Pub. Date: Aug. 17, 2000

(30) Foreign Application Priority Data

Feb. 11, 1999 (DE) .................................. 199 05 731

(51) Int. Cl.
H04B 7/00 (2006.01)
H04Q 7/20 (2006.01)
H03C 1/62 (2006.01)

(52) U.S. Cl. .................................... 455/522; 455/115.1
(58) Field of Classification Search ................ 455/522, 455/126, 127, 115.1, 114.3
See application file for complete search history.

(56) References Cited

U.S. PATENT DOCUMENTS

| 5,128,629 | A | * | 7/1992 | Trinh ........................ 330/129 |
| 5,179,353 | A | * | 1/1993 | Miyake ...................... 330/129 |
| 5,313,658 | A | | 5/1994 | Nakamura ................... 455/69 |
| 5,371,481 | A | * | 12/1994 | Tiittanen et al. ............ 332/103 |
| 5,394,159 | A | | 2/1995 | Schneider et al. ... 343/700 MS |
| 5,423,081 | A | | 6/1995 | Thiele et al. ............... 455/116 |
| 5,832,373 | A | * | 11/1998 | Nakanishi et al. .......... 455/126 |
| 5,854,971 | A | * | 12/1998 | Nagoya et al. ............. 455/126 |
| 6,038,428 | A | * | 3/2000 | Mizusawa et al. ........... 455/69 |
| 6,351,239 | B1 | * | 2/2002 | Mizuno et al. ...... 343/700 MS |
| 6,356,744 | B1 | * | 3/2002 | Zamat ........................ 455/126 |

FOREIGN PATENT DOCUMENTS

| EP | 0 388 894 A1 | 9/1990 |
| EP | 0 863 610 A2 | 9/1998 |
| WO | WO 98/43371 | 10/1998 |

OTHER PUBLICATIONS

Yang, Yao-Chou et al., "Active Patch Antennas Integrated with FETs using Coupled Transmission Lines," IEEE 1997, pp. 6-9.

* cited by examiner

Primary Examiner—Benny Quoc Tieu
(74) Attorney, Agent, or Firm—Bell, Boyd & Lloyd LLC

(57) ABSTRACT

A method and apparatus for controlling the power of a transmit amplifier wherein a portion of the power transmitted from the antenna is received by a coupling element and is converted via a radio-frequency detector to a DC voltage value which is used for power control, such that there is no longer any need for complex use of a directional coupler between the transmit amplifier and the antenna.

4 Claims, 5 Drawing Sheets

Stand der Technik

METHOD AND APPARATUS FOR REGULATING THE POWER OF A TRANSMIT AMPLIFIER

BACKGROUND OF THE INVENTION

The present invention relates to a method and an apparatus for controlling the power of a transmit amplifier; in particular, a transmit amplifier in a mobile radio terminal.

FIG. 2 shows an outline circuit diagram of a conventional arrangement for controlling the power of a transmit amplifier PA. The signals sig which are supplied to the transmit amplifier PA to be amplified are amplified on the basis of a control parameter reg, which is supplied to the transmit amplifier PA and represents a measure of the gain or the gain factor, and are supplied to a directional coupler RK. The directional coupler RK outputs a small proportion of the power supplied from the transmit amplifier PA to the antenna ANT, and supplies this to a radio-frequency detector HFD, which converts this power to a DC voltage. This DC voltage value produced in this way is supplied as the actual value act to a comparison device V, where it is compared with a nominal value NOM which is preset by a control device, such as a microcontroller for a mobile radio terminal. The result of the comparison is output as a control parameter reg which adjusts the gain of the transmit amplifier PA such that the actual value corresponds to the nominal value nom. For this purpose, the gain factor is raised or lowered depending on the difference between the nominal value and the actual value. The majority of the power is supplied from the directional coupler RK to the antenna ANT, from where this power is transmitted in the form of radio-frequency signals.

EP-0388894 discloses the reception, at the receiving end, of a portion of the power which is transmitted from an antenna of a mobile radio terminal at the transmission end. This results in the disadvantage that the power control process includes a base station and, thus, the network infrastructure. This leads to slow control with inertia as well as to additional signaling complexity between the base station and the network infrastructure. As a result, this can be used only in mobile radio terminals which are operated in a mobile radio system which supports this type of power control.

Every effort is being made throughout the world to develop mobile radio terminals which are as small and light as possible. The use of a directional coupler is not consistent with this aim, since it is relatively large, heavy and complex to produce.

The present invention is, thus, directed toward a method and an apparatus for controlling the power of a transmit amplifier which allow the power to be controlled both easily and reliably, and, in particular, without using a directional coupler.

SUMMARY OF THE INVENTION

According to the present invention, a portion of the power transmitted from an antenna is received and, in turn, used to control the power of the transmit amplifier.

The present invention is thus based on the idea that a portion of the power transmitted from the transmit amplifier is not output through a directional coupler, with this portion of the power being used, after further processing, to control the power of the transmit amplifier. Indeed, the present invention concerns supplying essentially all the power transmitted from the transmit amplifier to the antenna of a mobile radio terminal, transmitting this power via the antenna at the transmission end, and receiving a portion of the transmitted power at the transmission end, with this portion of the transmitted power being supplied, possibly after further processing, to the transmit amplifier in order to control its power.

This has the advantage that there is no need for the complex use of a directional coupler and the power can be controlled more accurately. This is because the actually transmitted power, or a portion of it, is used to control the power and not, as is normal in the prior art, a portion of the power which is supplied to the antenna prior to being transmitted.

A development of the present invention provides for an antenna and the part for receiving the transmitted power to be arranged on a base, which allows the arrangement for power control to be produced in an even simpler manner, particularly if the part for receiving the transmitted power and the antenna are produced as a planar or patch antenna. The part for receiving a portion of the power transmitted from an antenna, for the purposes of the present application, may include an antenna or parts of an antenna, such as a resonator.

Additional features and advantages of the present invention are described in, and will be apparent from, the following detailed description and the figures.

DETAILED DESCRIPTION OF THE INVENTION

Figure 1:
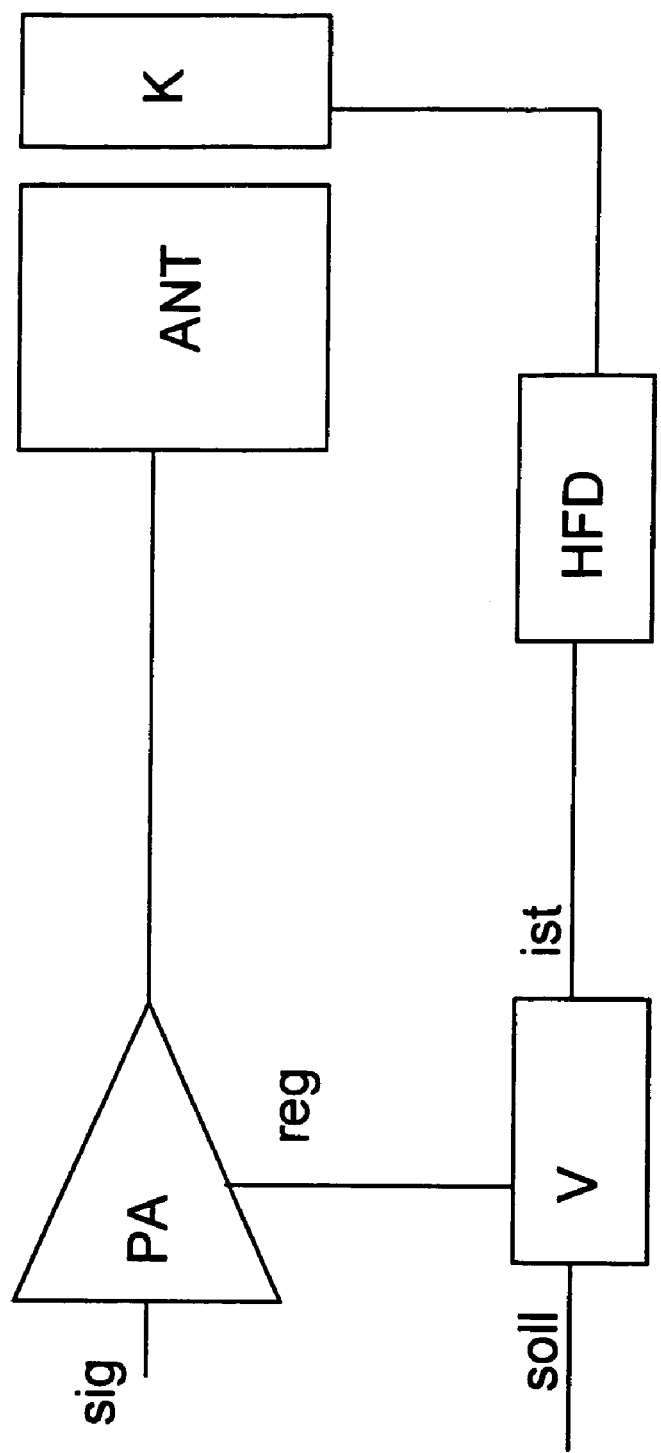
FIG. 1 shows an outline circuit diagram of an apparatus for controlling the power of a transmit amplifier in accordance with the teachings of the present invention.
Figure 2:
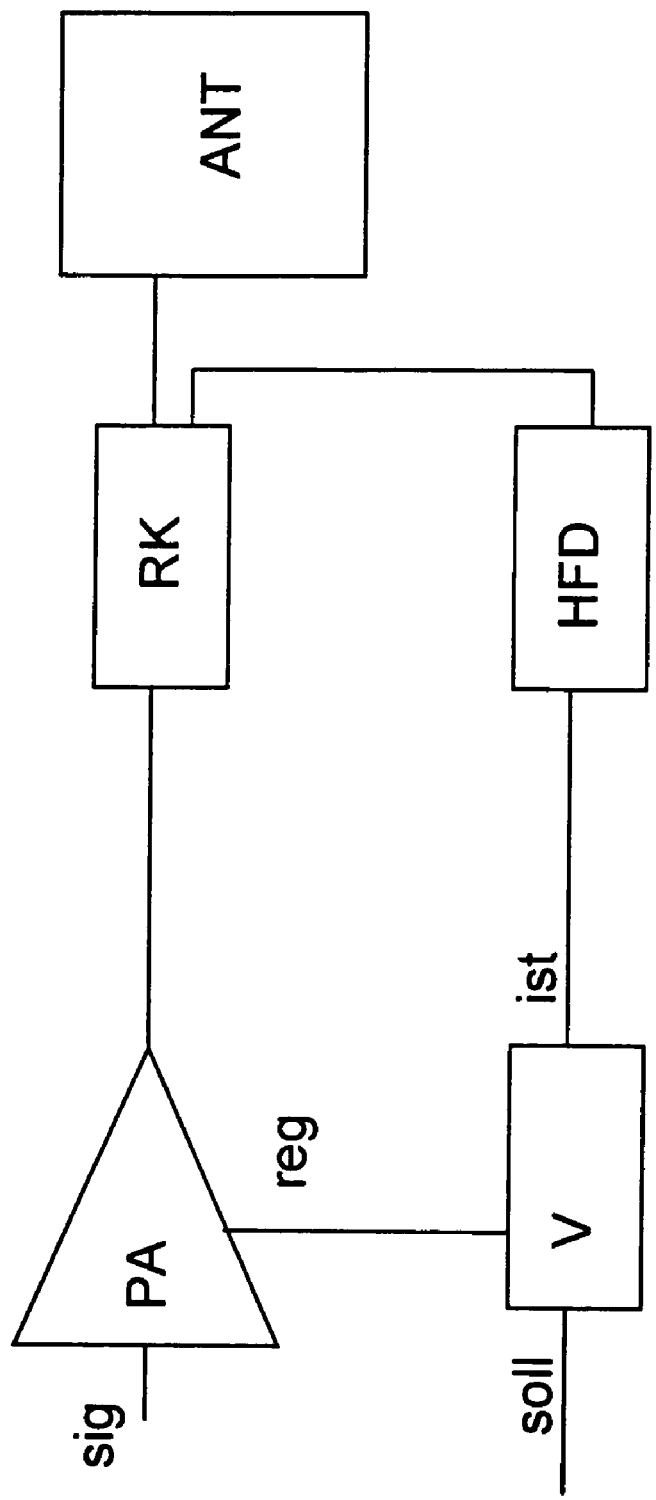
FIG. 2 shows an outline circuit diagram of a conventional arrangement for controlling the power of a transmit amplifier.

FIG. 1 shows an antenna ANT which transmits radio-frequency signals at a power level governed by the gain of a transmit amplifier PA. A coupling element K, which can be produced based on the same principle as an antenna, is dimensioned and arranged in such a manner that it receives a small proportion of the power transmitted from the antenna ANT. Thus, it outputs a portion of the power transmitted from the antenna ANT. This portion (which is received by the coupling element K) of the power transmitted by the antenna ANT is converted by a radio frequency detector HFD to a DC voltage value, which thus represents a measure of the power transmitted by the antenna ANT. This DC voltage value is supplied as the actual value to a comparison device V, such as a comparator circuit. This actual value is compared in the comparison device V with a nominal value nom, which is preset by a control device such as the microcontroller of a mobile radio terminal, for power control. Depending on the comparison result, the comparison device V transmits a control parameter reg, which adjusts the gain factor of the transmit amplifier PA such that the signals sig to be amplified are transmitted from the antenna ANT at a power level such that the actual value act corresponds to the nominal value nom. This is done by raising or lowering the gain factor depending on the difference between the nominal and actual values.

In order to illustrate the exemplary embodiments clearly, the drawings do not illustrate antenna switches, diplexers, or duplexers.

Figure 3:
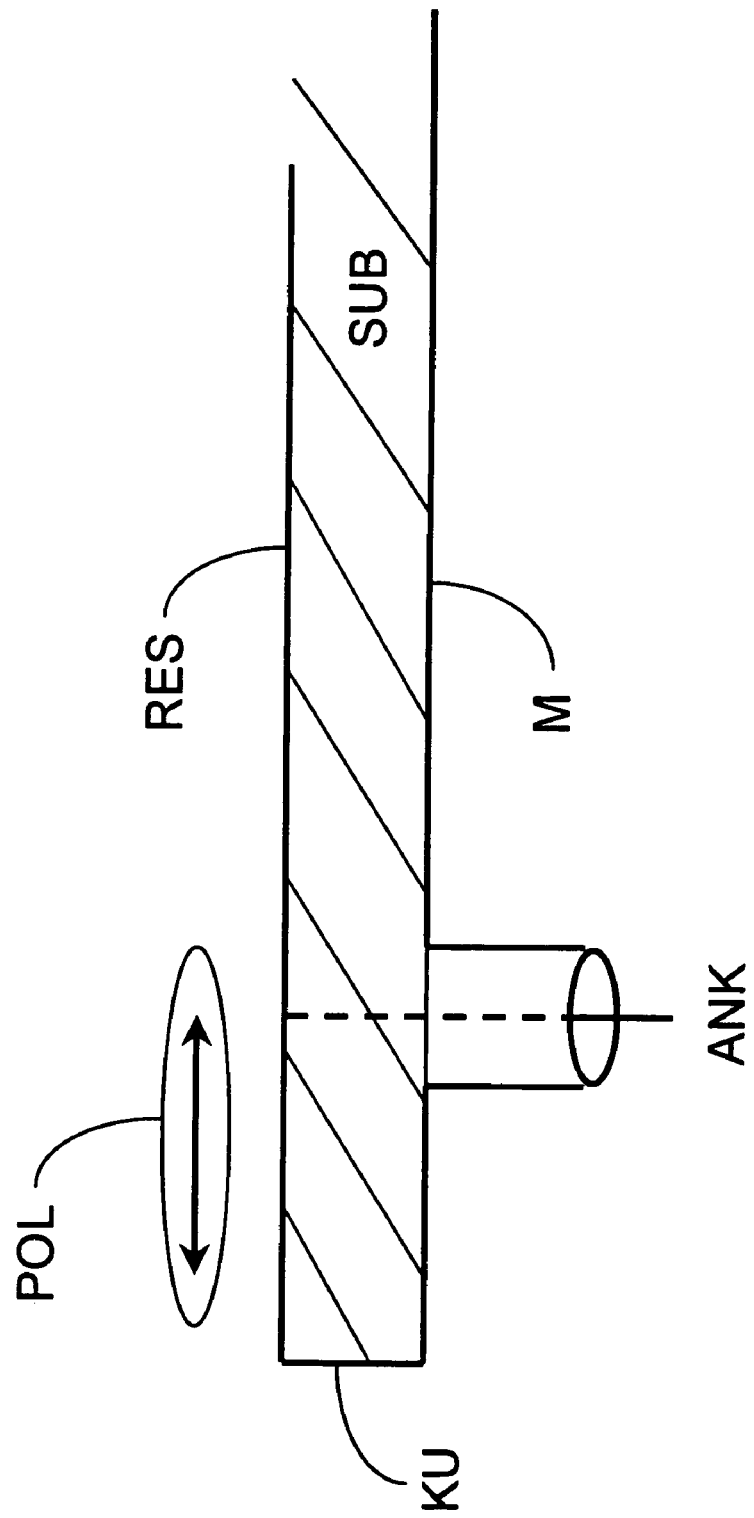
FIG. 3 shows a schematic cross-sectional illustration of a planar antenna and of a planar coupling element.

The principle of a planar antenna or patch antenna can be used for the antenna ANT and/or the coupling element K. FIG. 3 shows a sectional illustration of such a planar antenna or patch antenna including a coupling device ANK, a ground surface M, an insulated, (for example, ceramic) substrate SUB, a resonator RES and a short circuit KU between the resonator RES and the ground surface M. The double arrow indicates the polarization direction POL of such a patch antenna. The signals also can be coupled in a different way to that illustrated; for example capacitively. The radio-frequency supply or coupling may be in the form of a coaxial inner conductor.

Figure 4:
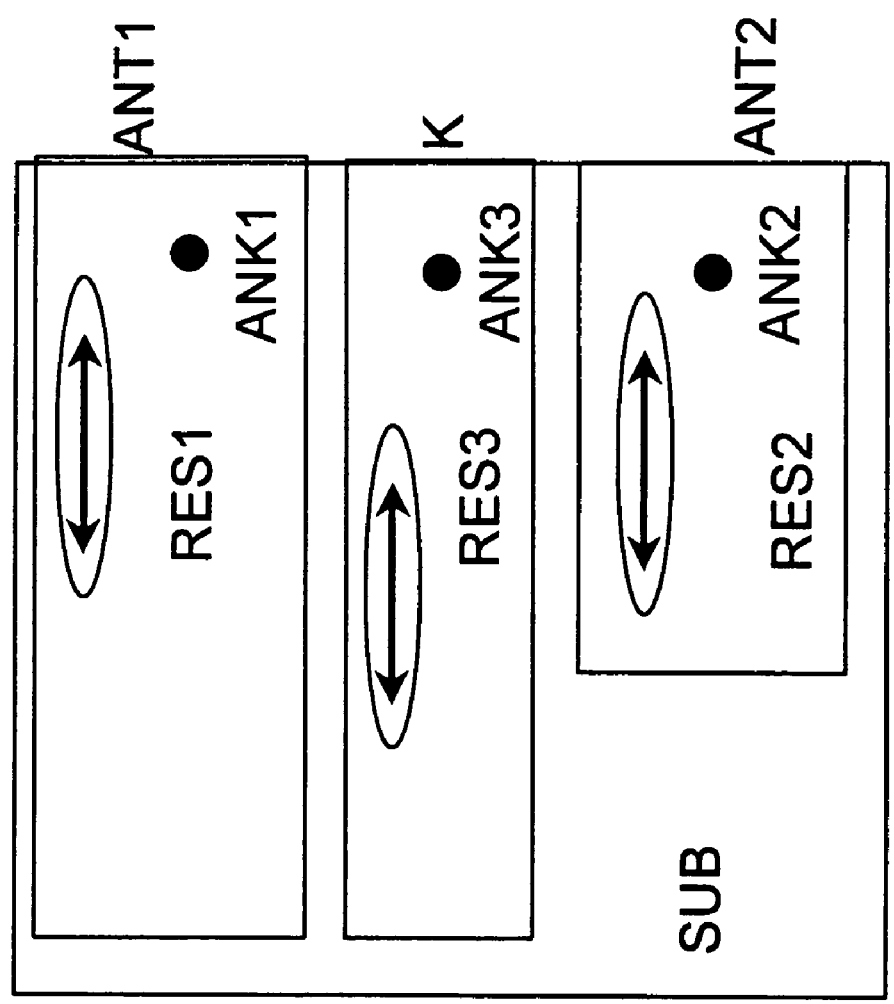
FIG. 4 shows a schematic illustration of planar antennas having a coupling element on a substrate.

FIG. 4 shows an antenna arrangement which, in an appropriate manner for transmission and reception operation, includes two antennas ANT1, ANT2, which are arranged on a base, such as a board or a substrate SUB, with appropriate coupling devices ANK1, ANK2, resonators RES1, RES2 and short circuits (which are not illustrated) between the ground surface and the resonators. The amplified radio-frequency signals are supplied from the transmit amplifier PA to the transmit antenna ANT1 via the coupling device ANK1. The signals received by the correspondingly designed receiving antenna ANT2 are supplied via the coupling device ANK2 to a receive amplifier. The coupling element K may be provided either on another substrate or, as illustrated by way of example in this drawing, on the same substrate SUB, likewise based on the principle of a planar antenna or patch antenna. In this case, the coupling element K likewise has a resonator RES3 and a coupling device ANK3. The coupling resonator RES3 is connected to the radio-frequency detector HFD via the feed point and/or the coupling device ANK3.

In alternative embodiments of the present invention, the various antennas also may be antennas of a dual-band antenna arrangement or multi-band antenna arrangement. This allows, for example, a mobile radio terminal to be operated in different frequency bands. Another embodiment variant provides for different antennas and/or resonators in each case to be provided for the transmit band and the receive band when using two different frequency bands, as can be achieved by mounting four resonators on a substrate for a dual-band antenna arrangement. The resonator for the coupling element K also may be in the form of a fifth resonator on the same substrate.

Figure 5:
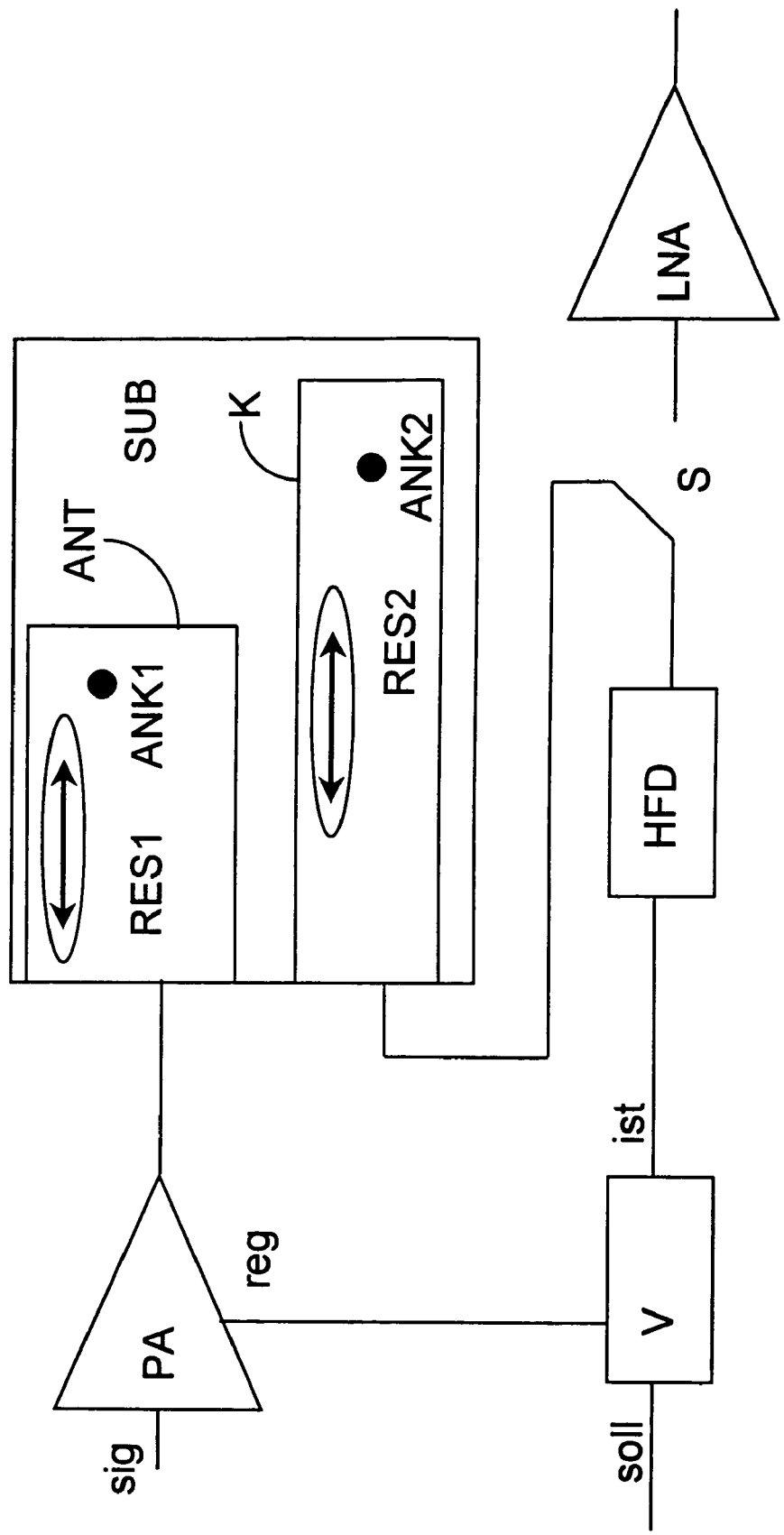
FIG. 5 shows an outline circuit diagram of an alternative embodiment of the apparatus for controlling the power of a transmit amplifier of the present invention.

FIG. 5 shows an antenna arrangement in which the resonator RES1 is tuned to the transmit frequency band, and the resonator RES2 is tuned to the receive frequency band. During reception, the resonator RES2 is active and the received signal is supplied via a switching device S to the receive amplifier LNA. During transmission, the resonator RES1 is active, and the resonator RES2 carries out the function of a coupling element K, whose output signal is now supplied to the radio-frequency detector HFD once the switching device S has switched over. The switching device S may, in this case, be controlled by a control device, such as a microcontroller in the mobile radio terminal. The comparison of the actual value act and the nominal value nom, and the control of the transmit amplifier PA as a function of this, are carried out in accordance with the description relating to FIG. 1. A development provides for the antenna arrangement to be a dual-band antenna arrangement, which has four resonators, with one resonator in each case being provided for transmitting and receiving in each of the two frequency bands. During transmit operation, the reception resonators are used as coupling elements. The reception resonators are switched over to the receive amplifier LNA and the radio-frequency detector HFD, as described above, by a controlled switching device.

Although the present invention has been described with reference to specific embodiments, those of skill in the art will recognize that changes may be made thereto without departing from the spirit and scope of the invention as set forth in the hereafter appended claims.

What is claimed is:

1. A method for controlling the power of a transmit amplifier of a mobile radio terminal, the method comprising the steps of:
   receiving a portion of the power transmitted from an antenna of the mobile radio terminal at the transmission end of said antenna by a coupling element of the mobile radio terminal; and
   using the portion of the power transmitted to control the power of the transmit amplifier.

2. An apparatus for controlling the power of a transmit amplifier of a mobile radio terminal, comprising:
   a part for receiving a portion of the power transmitted from an antenna of the mobile radio terminal; and
   a part for controlling the power of the transmit amplifier as a function of the received portion of the power transmitted.

3. An apparatus for controlling the power of a transmit amplifier of a mobile radio terminal as claimed in claim 2, wherein the antenna of the mobile radio terminal is a planar antenna having a first resonator mounted on a substrate, the part for receiving a portion of the power transmitted has a second resonator, and the first and second resonators are mounted on the same substrate.

4. An apparatus for controlling the power of a transmit amplifier of a mobile radio terminal as claimed in claim 2, wherein the part for receiving a portion of the power transmitted is provided, during transmission operation of the mobile radio terminal, at least partially by a receiving antenna of the mobile radio terminal.

* * * * *